United States Patent
Nakanishi et al.

(10) Patent No.: US 7,449,726 B2
(45) Date of Patent: Nov. 11, 2008

(54) POWER SEMICONDUCTOR APPARATUS

(75) Inventors: Hidetoshi Nakanishi, Tokyo (JP);
Toshitaka Sekine, Tokyo (JP); Taichi Obara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 3 days.

(21) Appl. No.: 11/610,624

(22) Filed: Dec. 14, 2006

(65) Prior Publication Data
US 2008/0017882 A1    Jan. 24, 2008

(30) Foreign Application Priority Data
Jul. 18, 2006  (JP) .............................. 2006-196259

(51) Int. Cl.
*H01L 31/0203* (2006.01)

(52) U.S. Cl. .................. 257/177; 257/150; 257/151; 257/178; 257/180; 257/182; 257/675; 257/692; 257/706; 257/712; 257/723; 257/E25.031; 257/E23.183; 257/E23.184; 257/E23.186; 257/E23.123; 257/E23.124; 257/787; 361/704; 361/728

(58) Field of Classification Search .............. 257/150, 257/151, 177, 178, 180, 182, 675, 692–696, 257/704, 706, 712, 713, 717, 720, 723, 787, 257/E25.031, E23.183, E23.184, E23.186, 257/E23.123, E23.124; 361/704, 709, 723, 361/728, 813
See application file for complete search history.

(56) References Cited

U.S. PATENT DOCUMENTS 6,087,682 A * 7/2000 Ando ........................ 257/178
7,256,431 B2 * 8/2007 Okamoto .................... 257/177

FOREIGN PATENT DOCUMENTS

| JP | 62-79653 | 4/1987 |
| JP | 2001-85613 | 3/2001 |
| KR | 10-0536115 | 12/2005 |

* cited by examiner

*Primary Examiner*—Minh-Loan Tran
*Assistant Examiner*—Leslie Pilar Cruz
(74) *Attorney, Agent, or Firm*—Oblon, Spivak, McClelland, Maier & Neustadt, P.C.

(57) ABSTRACT

The power semiconductor apparatus includes a resin package made up of a power semiconductor element and a control semiconductor element which are mounted on a main front surface of a lead frame and sealed with mold resin, a power terminal led out of the resin package and electrically connected to the power semiconductor element, a control terminal led out of the resin package and electrically connected to the control semiconductor element and a cylindrical case which is formed in a manner separable from the resin package and encloses the resin package, wherein the power terminal and the control terminal are led out of lead insertion slots formed in the case, and a part of the power terminal which is led out of the case is bent along an end face of the case.

9 Claims, 2 Drawing Sheets

POWER SEMICONDUCTOR APPARATUS

BACKGROUND OF THE INVENTION

1. Field of the Invention

The present invention relates to a case type power semiconductor apparatus which encloses a power semiconductor element and a control semiconductor element with a case, and more particularly, to a power semiconductor apparatus providing excellent productivity and moreover excellent recyclability which facilitates reuse of the case.

2. Background Art

In recent years, there is a growing demand for IPM modularization of an IGBT module (Insulated Gate Bipolar Transistor) used for industrial motor control and servo applications. Here, "IPM" is a power module which incorporates a drive circuit and a self protection function for a power device such as a MOSFET and IGBT which controls power.

A mold type IPM is used for consumer applications. This mold type IPM is made up of an IC and a power semiconductor chip (IGBT, diode) which are die-mounted on a Cu frame and consolidated with epoxy mold resin. There is also a proposal of a mold type IPM provided with a heat sink to improve a heat radiation characteristic (for example, see Japanese Patent Laid-Open No. 2001-085613).

On the other hand, a case type IPM is used as a small/medium capacity industrial IPM (600V/50 A or above). FIG. 3 is a sectional view showing a conventional case type IPM and FIG. 4 is a top view thereof. An insertion case 1 incorporates an insulating substrate 4 mounted with an IGBT chip 2 and a diode 3 as power semiconductor elements and a mounting substrate 5 mounted with a control IC as a control semiconductor element, resistors and capacitors. These components are connected to each other using Al wires 6.

Furthermore, the IGBT chip 2 and diode 3 are connected to the outside through a power terminal 7 incorporated in the insertion case 1. The mounting substrate 5 is connected to the outside through a control terminal 8 incorporated in the insertion case 1. Furthermore, a Cu base 9 is formed on the back side of the insulating substrate 4 to radiate heat from the IGBT chip 2 and diode 3. Moreover, case rings 10 are provided in the four corners of the insertion case 1.

However, compared to the mold type IPM, the case type IPM includes more parts and requires higher assembly cost, and is therefore inferior in productivity. Furthermore, as in the case of the mold type IPM, the case type IPM involves a problem that when the case is filled with resin, the case cannot be reused.

SUMMARY OF THE INVENTION

The present invention has been implemented to solve the above described problems and it is an object of the present invention to provide a case type power semiconductor apparatus providing excellent productivity and excellent recyclability facilitating reuse of the case.

According to one aspect of the present invention, the power semiconductor apparatus includes a resin package made up of a power semiconductor element and a control semiconductor element which are mounted on a main front surface of a lead frame and sealed with mold resin, a power terminal led out of the resin package and electrically connected to the power semiconductor element, a control terminal led out of the resin package and electrically connected to the control semiconductor element and a cylindrical case which is formed in a manner separable from the resin package and encloses the resin package, wherein the power terminal and the control terminal are led out of lead insertion slots formed in the case, and a part of the power terminal which is led out of the case is bent along an end face of the case.

The present invention makes it possible to realize a case type power semiconductor apparatus providing excellent productivity and excellent recyclability facilitating reuse of the case.

Other and further objects, features and advantages of the invention will appear more fully from the following description.

DETAILED DESCRIPTION OF THE PREFERRED EMBODIMENTS

First Embodiment

Figure 1:
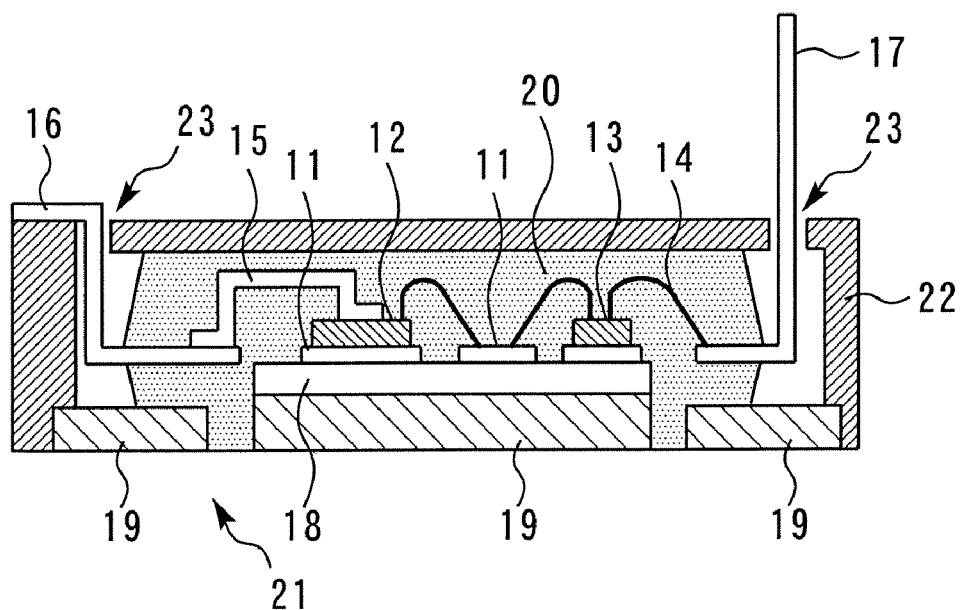
FIG. 1 is a sectional view showing a power semiconductor apparatus according to Embodiment 1 of the present invention.

FIG. 1 is a sectional view showing a power semiconductor apparatus according to Embodiment 1 of the present invention. A power semiconductor element 12 such as an IGBT chip and diode and a control semiconductor element 13 such as a control IC are mounted on the main front surface of lead frames 11. These components are electrically connected to each other through Al wires 14. Furthermore, the power semiconductor element 12 is electrically connected to a power terminal 16 through a Cu terminal 15 and the control semiconductor element 13 is electrically connected to a control terminal 17 through an Al wire 14.

A heat sink 19 is provided through an insulation sheet 18 on the main back surface of the lead frame 11. A resin package 21 is formed by sealing these components with mold resin 20. Furthermore, the power terminal 16 and control terminal 17 are led out of the resin package 21. A part of the outside surface of the heat sink 19 is exposed from the resin package 21. The heat radiation characteristic of the resin package 21 can be improved by this heat sink 19. More specifically, the heat resistance is 0.6° C./W at 600 V/50 A and it is possible to achieve heat resistance substantially equivalent to that of the conventional case type IPM. The heat sink 19 requires no fixing means.

The resin package 21 is enclosed by a cylindrical insertion case 22 made of plastic. The power terminal 16 and control terminal 17 are led out of lead insertion slots 23 which are provided in the insertion case 22. Moreover, the part of the power terminal 16 which is led out of the insertion case 22 is bent along the end face of the insertion case 22. An outside wire (not shown) is made to contact the bent part of this power terminal 16 and the two parts are connected with a screw which penetrates the two parts.

As explained above, partially adopting a mold type IPM structure makes it possible to reduce assembly parts and reduce cost compared to the conventional case type IPM and realize a power semiconductor apparatus providing excellent productivity. Moreover, the power semiconductor apparatus according to this embodiment has the same locations of the power terminal and the control terminal as the conventional case type IPM in appearance, which allows the customer to handle the apparatus using the same assembly method as that for the conventional case type IPM and eliminates the necessity for modifying the apparatus.

Furthermore, by avoiding the mold resin 20 from filling the insertion case 22, the insertion case 22 is made separable from the resin package 21. In this way, when the power semiconductor element 12 and the control semiconductor element 13 or the like are damaged, only the resin package 21 can be replaced. Therefore, it is possible to realize a power semiconductor apparatus providing excellent recyclability which makes reuse of the case easier.

Furthermore, peripheral edges of the heat sink 19 protrude from peripheral edges of an enclosure of the resin package 21 and are engaged with open end edges of the insertion case 22. This eliminates the necessity for fixing means for fixing the resin package 21 to the insertion case 22, and can thereby provide a power semiconductor apparatus providing excellent assemblability, that is, excellent productivity.

Embodiment 2

Figure 2:
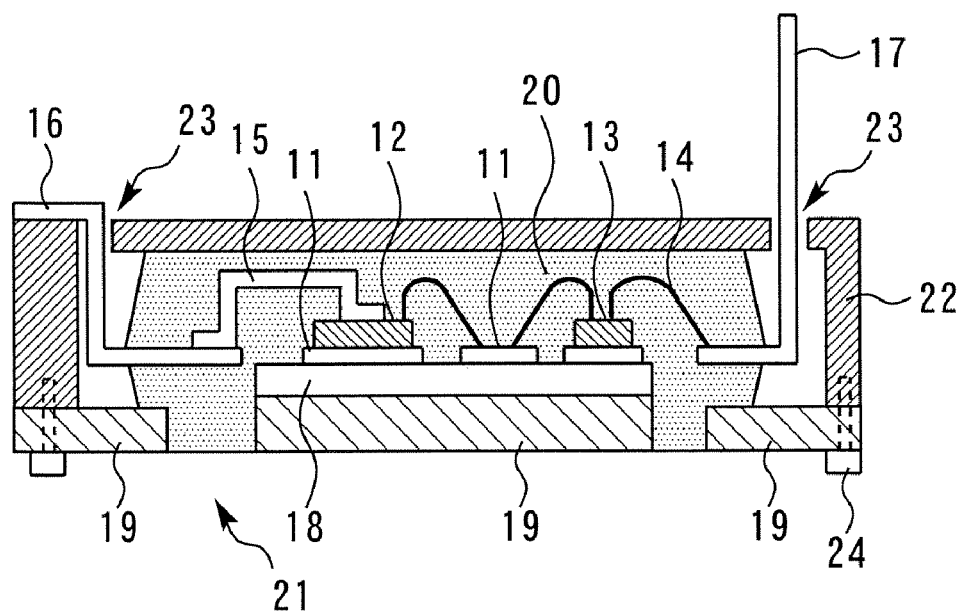
FIG. 2 is a sectional view showing a power semiconductor apparatus according to Embodiment 2 of the present invention.
Figure 3:
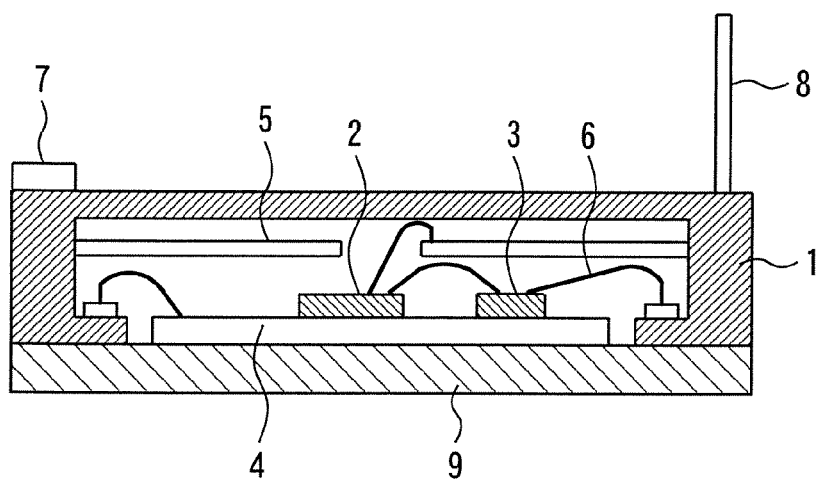
FIG. 3 is a sectional view showing a conventional case type IPM.
Figure 4:
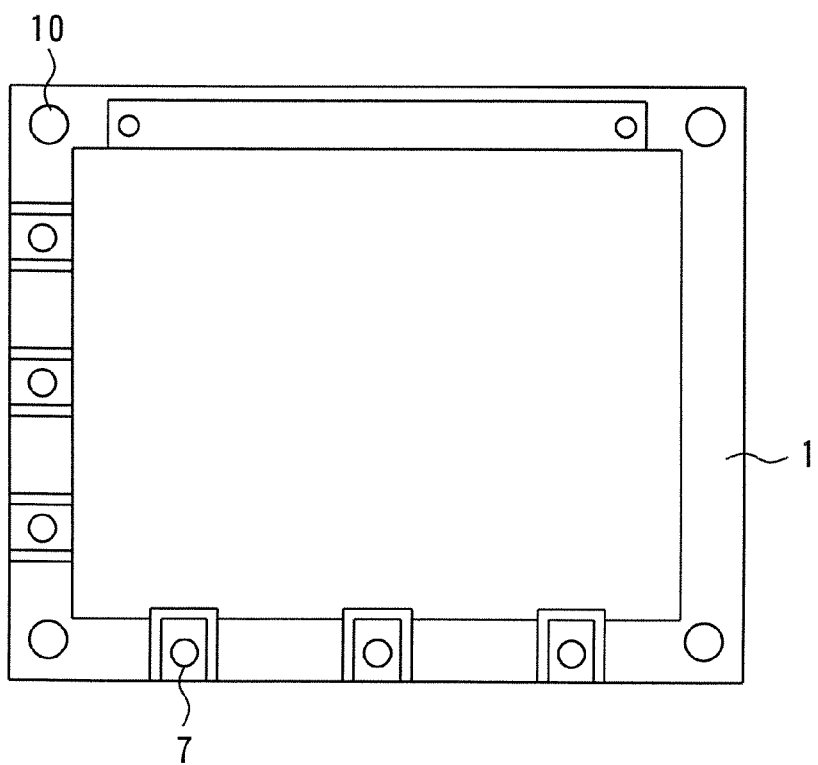
FIG. 4 is a top view showing a conventional case type IPM.

FIG. 2 is a sectional view showing a power semiconductor apparatus according to Embodiment 2 of the present invention. In this embodiment, peripheral edges of a heat sink 19 protrude from peripheral edges of an enclosure of a resin package 21 and are connected to open end edges of an insertion case 22 using bolts 24. The rest of the configuration is the same as that of Embodiment 1.

In this way, it is possible to reduce the number of parts and provide a power semiconductor apparatus with excellent assemblability, that is, excellent productivity. Furthermore, the strength of mounting the resin package and the case is greater than that of Embodiment 1.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-196259, filed on Jul. 18, 2006 including specification, claims, drawings and summary, on which the Convention priority of the present application is based, are incorporated herein by reference in its entirety.

What is claimed is:

1. A power semiconductor apparatus comprising:
   a resin package including a power semiconductor element and a control semiconductor element which are mounted on a main front surface of a lead frame and sealed with mold resin;
   a power terminal leading out of said resin package and electrically connected to said power semiconductor element;
   a control terminal leading out of said resin package and electrically connected to said control semiconductor element; and
   a case which is formed in a manner separable from said resin package and encloses said resin package,
   wherein said power terminal and said control terminal are led out of lead insertion slots formed in said case, and
   a part of said power terminal which is led out of said case is bent along an end face of said case.

2. The power semiconductor apparatus according to claim 1, wherein said resin package further comprises a heat sink provided on a main back surface of said lead frame and a part of an outside surface is exposed from said resin package.

3. The power semiconductor apparatus according to claim 2, wherein the peripheral edges of said heat sink protrude from peripheral edges of an enclosure of said resin package and are engaged with open end edges of said case.

4. The power semiconductor apparatus according to claim 2, wherein the peripheral edges of said heat sink protrude from peripheral edges of an enclosure of said resin package and are connected to open end edges of said case using bolts.

5. The power semiconductor apparatus according to claim 1, wherein between an inner wall of the case and an outer side of the mold resin that forms the resin package, an open space is provided where the mold resin is not in contact with the case.

6. The power semiconductor apparatus according to claim 5, wherein at least one of the power terminal and the control terminal is led out at the outer side from the mold resin into the open space.

7. The power semiconductor apparatus according to claim 5, wherein at least one of the power terminal and the control terminal is not in contact with the inner wall of the case.

8. The power semiconductor apparatus according to claim 1, wherein the peripheral edges of said heat sink protrude laterally from the outer side of the mold resin.

9. The power semiconductor apparatus according to claim 1, wherein the case has a cylindrical shape.

* * * * *